United States Patent [19]

Berkcan

[11] Patent Number: 5,446,372
[45] Date of Patent: * Aug. 29, 1995

[54] NONINDUCTIVE SHUNT CURRENT SENSOR WITH SELF-POWER CAPABILITY

[75] Inventor: Ertugrul Berkcan, Schenectady, N.Y.

[73] Assignee: General Electric Company, Schenectady, N.Y.

[*] Notice: The portion of the term of this patent subsequent to May 30, 2095 has been disclaimed.

[21] Appl. No.: 208,551

[22] Filed: Mar. 10, 1994

Related U.S. Application Data

[63] Continuation-in-part of Ser. No. 85,787, Jul. 6, 1993, Pat. No. 5,420,504.

[51] Int. Cl.⁶ .................................................. H01F 38/28
[52] U.S. Cl. .................................. 324/126; 324/117 R; 324/127
[58] Field of Search ................ 324/126, 127, 117 R, 324/244.1; 338/49, 61, 272

[56] References Cited

U.S. PATENT DOCUMENTS

| | | | |
|---|---|---|---|
| 720,335 | 2/1903 | Eastman | 324/126 |
| 2,440,679 | 5/1948 | Fountain | 324/126 |
| 2,568,600 | 9/1951 | Wirk | 338/61 |
| 2,831,164 | 4/1958 | Johnson | 324/127 |
| 3,372,334 | 3/1968 | Fenoglio et al. | 324/127 |
| 3,665,357 | 5/1972 | Tsubouchi et al. | 336/73 |
| 3,921,069 | 11/1975 | Milkovic | 324/117 H |
| 3,995,210 | 11/1976 | Milkovic | 323/4 |
| 4,140,961 | 2/1979 | Akamatsu | 324/126 |
| 4,182,982 | 1/1980 | Wolf et al. | 324/127 |
| 4,240,059 | 12/1980 | Wolf et al. | 338/49 |
| 4,255,704 | 3/1981 | Milkovic | 324/127 |
| 4,255,705 | 3/1981 | Milkovic | 324/127 |
| 4,278,940 | 7/1981 | Milkovic | 324/127 |
| 4,286,214 | 8/1981 | Milkovic | 324/127 |
| 4,322,710 | 3/1982 | Carson et al. | 338/61 |
| 4,414,510 | 11/1983 | Milkovic | 324/252 |
| 4,492,919 | 1/1985 | Milkovic | 324/127 |
| 4,494,068 | 1/1985 | Ley et al. | 324/126 |
| 4,495,463 | 1/1985 | Milkovic | 324/130 |
| 4,513,274 | 4/1985 | Halder | 324/127 |
| 4,580,095 | 4/1986 | DeVries | 324/126 |
| 4,626,778 | 12/1986 | Friedl | 324/127 |
| 4,684,827 | 8/1987 | Ohms | 324/127 |
| 4,794,326 | 12/1988 | Friedl | 324/117 R |
| 4,810,989 | 3/1989 | Brandenberg et al. | 324/127 |
| 4,835,463 | 5/1989 | Baran et al. | 324/126 |
| 4,894,610 | 1/1990 | Friedl | 324/127 |
| 4,939,451 | 7/1990 | Baran et al. | 324/126 |
| 4,947,107 | 8/1990 | Doerfler et al. | 324/96 |
| 4,999,692 | 3/1991 | Ristic et al. | 357/36 |
| 5,027,059 | 6/1991 | de Montgolfier et al. | 324/126 |
| 5,066,904 | 11/1991 | Bullock | 324/126 |

OTHER PUBLICATIONS

"Faraday Effect Sensors: The State of the Art," G. W. Day, A. H. Rose, SPIE vo. 985, Fiber Optic and Laser Sensors VI (1988), pp. 138–150.

"Integrated Semiconductor Magnetic Field Sensors," Henry P. Baltes, Proceedings of the IEEE, vol. 74, No. 8, Aug. 1986, pp. 1107–1132.

"GE Type EV and Phase3 Meters, Signal Conditioning and Scaling," Donald F. Bullock, David D. Elmore, GE Meter & Control Business, Somersworth, N.H. 03878, Mar. 1991.

Primary Examiner—Vinh P. Nguyen
Attorney, Agent, or Firm—Enrique J. Mora; Marvin Snyder

[57] ABSTRACT

A noninductive shunt current sensor includes a cylindrical-shaped conductive element and a concentric conductive pipe electrically connected at one end by a conductor, such as a washer. Except for the conductor, the pipe and conductive element are electrically isolated from each other by insulation, such as a polyimide or an air-gap. Sensing wires are electrically connected to contact points, each contact point being located on either the inner surface of the inner pipe or the outer surface of the outer pipe. The wires pass through a space where the magnetic field is substantially null, thereby minimizing any mutual coupling effects. A magnetic core and a coil can be situated between the pipe and the conductive element to provide an electrical self-power capability to the noninductive shunt current sensor.

18 Claims, 5 Drawing Sheets

5,446,372

NONINDUCTIVE SHUNT CURRENT SENSOR WITH SELF-POWER CAPABILITY

RELATED APPLICATIONS

This application is a continuation-in-part of patent application Ser. No. 08/085,787, filed Jul. 6, 1993 (now U.S. Pat. No. 5,420,504) (RD-22,251) and is related to patent application Ser. No. 08/085,788 (RD-22,357) entitled "Current Sensor Employing a Mutually Inductive Current Sensing Scheme," by Berkcan et al., filed Jul. 6, 1993, patent application Ser. No. 08/085,790 (RD-23,045) entitled "Current Sensor Employing a Mutually Inductive Current Sensing Scheme with a Magnetic Field Substantially Uniform in Angular Direction," by Berkcan et al., filed Jul. 6, 1993 and patent application Ser. No. 08/085,789 (RD-22,349) entitled "Reduced Time Rate of Change Magnetic Flux Current Sensor," by Berkcan, filed Jul. 6, 1993, all of the foregoing assigned to the assignee of the present invention and herein incorporated by reference.

FIELD OF THE INVENTION

The present invention relates to current sensors and, more particularly, to a noninductive shunt current sensor having a self-power capability.

BACKGROUND OF THE INVENTION

Various forms of current sensors are known in the art, such as U.S. Pat. No. 5,066,904, entitled "Coaxial Current Sensors," by Bullock, issued Nov. 19, 1991, assigned to the assignee of the present invention and herein incorporated by reference. State of the art current sensors typically suffer from several disadvantages, such as the need for magnetic insulation to avoid the effects of external electromagnetic fields upon the current measurements obtained. Likewise, current sensors may suffer from difficulties associated with the sensing wires that may introduce nonlinearities due to mutual coupling and other electromagnetic effects. Likewise, due to the materials often used, such as iron or magnetic cores, and the manufacturing care necessary to manufacture the current sensor, accurate current sensors are sometimes more costly than desired for the particular application, such as a typical metering application. Such current sensors may also be heavy or bulky for the particular application. Further, state of the art current sensors typically use signal conditioning circuitry which generally requires the use of external power supplies or the use of optical power interfaces to provide suitable electrical isolation and that in each case compromises the portability of the current sensor. A need thus exists for a device or method for sensing or measuring current that overcomes these disadvantages.

SUMMARY OF THE INVENTION

One object of the invention is to provide a current sensor that employs a noninductive current sensing scheme.

Another object of the invention is to provide a current sensor having a self-power capability.

Briefly, in accordance with one embodiment of the invention, a noninductive shunt current sensor comprises a cylindrical-shaped conductive element and a concentric conductive pipe, the conductive element and the pipe being electrically connected at one end by a conductor, such as a washer, and electrically insulated from each other elsewhere. A magnetic core element having a coil is situated between the conductive element and the pipe to provide a self-power capability to the noninductive shunt current sensor.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

FIG. 3 is a cross-sectional front view of the embodiment illustrated in FIGS. 1a and 1b taken in the direction illustrated in FIG. 1a.

DETAILED DESCRIPTION OF THE INVENTION

Figure 1A:
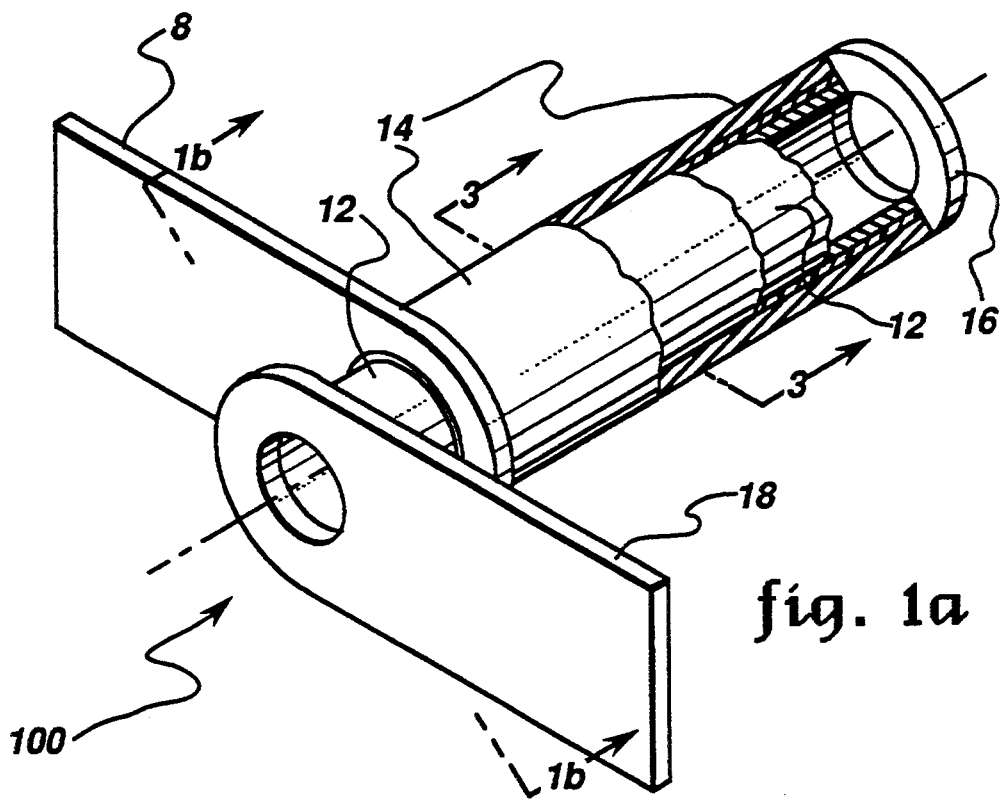
FIG. 1a is an isometric, partially cut-away view of one embodiment of a noninductive shunt current sensor in accordance with the invention.
Figure 2:
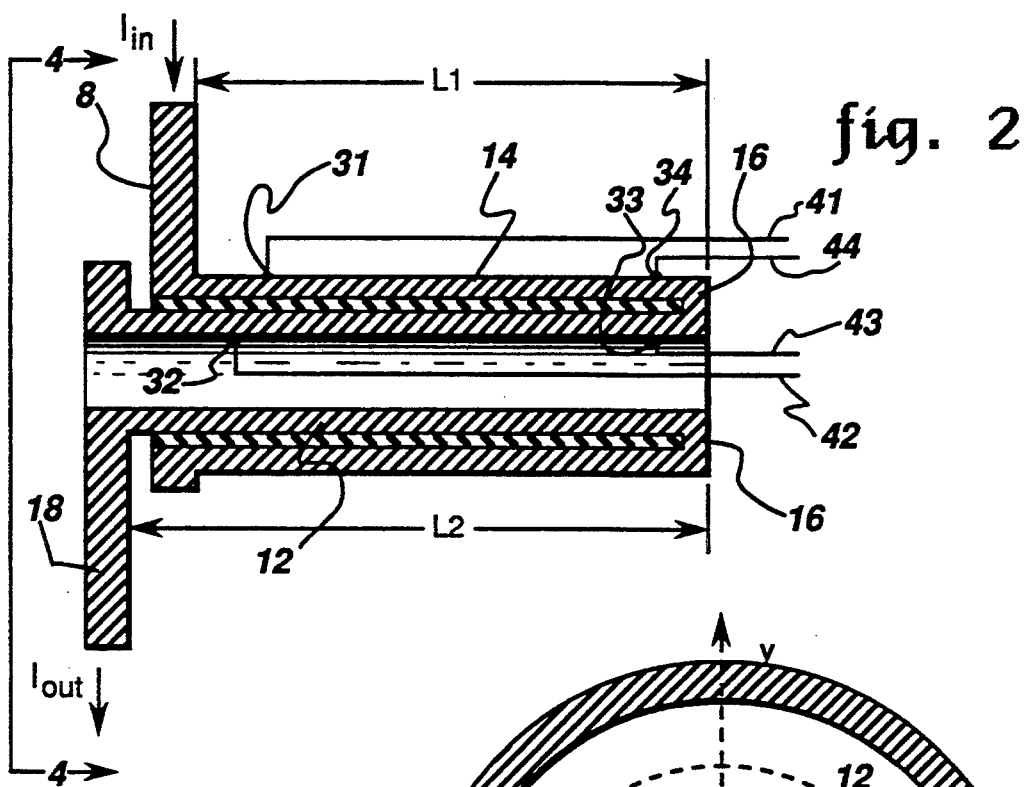
FIG. 2 is a cross-sectional side view of the embodiment illustrated in FIGS. 1a and 1b showing electrical connections.

FIG. 1a illustrates one embodiment of a noninductive shunt current sensor 100 in accordance with the invention. The current sensor embodiment illustrated utilizes a measurement of voltage for assessing the value of the current. The input current, $I_{in}$, is carried by a conductor 8, such as a conductive plate, to a pair of nested concentric conductive pipes or hollow cylinders, cylinder 12 being the inner cylinder and cylinder 14 being the outer cylinder. Hollow cylinder 12 may alternatively take the form of a solid cylindrical-shaped conductive element, such as illustrated by the embodiment in FIG. 7. The conductive cylinders are connected by a conductive end-piece or washer 16. Except for end-piece 16, an insulating material, such as an air gap or other insulation, such as Kapton ™ polyimide available from the E.I., Du Pont de Nemours Company, Wilmington, Del., isolates the surfaces of the two cylinders or pipes physically and electrically. Thus, a series-connected path for current flow through both cylinders is thereby established, such as further illustrated in FIG. 2. The output current, $I_{out}$, leaves the concentric pipes or cylinders by conductor 18. Thus, conductor 8 and conductor 18 are typically connected in series with a current source. It will be appreciated that the invention is not limited in scope to the direction of the current flow illustrated. Current flowing in the opposite direction will also provide satisfactory performance. As illustrated in FIG. 2, the end of cylinder 12 opposite end-piece 16 extends beyond the end of cylinder 14 also opposite the end-piece. The ends of the two cylinders are substantially coplanar where they directly contact conductive end piece or washer 16. Voltage is measured inside inner cylindrical conductor or pipe 12. It will be appreciated that pipes 12 and 14 and end-piece 16 may be comprised of metal, such as copper, gold, or silver, or other electrically conductive materials.

Due to the geometry employed, as explained in more detail hereinafter, substantially no magnetic induction, and hence substantially no magnetic field, is present inside inner cylindrical conductor 12, thus allowing a noninductive measurement of the shunt voltage. Furthermore, both inner and outer cylindrical conductors may be manufactured from materials having a small temperature coefficient of resistance, for example, on the order of 20 ppm per degree centigrade, such as may be provided by various metal alloys including Advance TM, Karma TM, Nikrothallx TM, as well as other commercially available materials.

Figure 3:
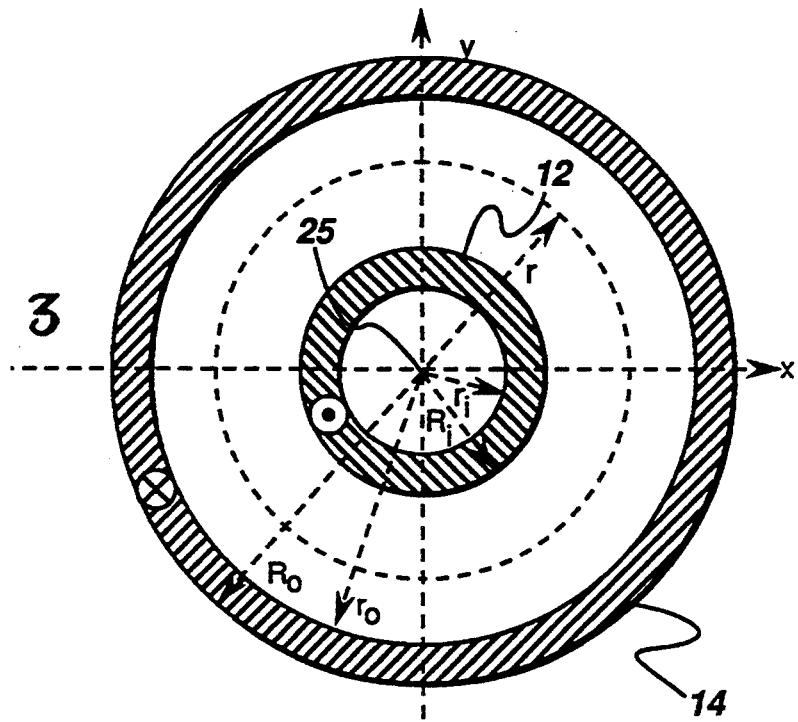

FIG. 3 illustrates a cross-sectional front view of the embodiment illustrated in FIG. 1a taken in the direction illustrated in FIG. 1a. The magnitude of the electromagnetic field within various concentric circles centered about point 25 is provided by the following equations:

$$H(r) = \begin{cases} 0, & r \leq r_i, r \geq R_o \\ \dfrac{I}{2\pi r} \dfrac{r^2 - r_i^2}{R_i^2 - r_i^2} & r_i \leq r \leq R_i \\ \dfrac{I}{2\pi r} & r_i \leq r \leq r_o \\ \dfrac{I}{2\pi r} \dfrac{R_o^2 - r^2}{R_o^2 - r_o^2} & r_o \leq r \leq R_o, \end{cases} \quad [1]$$

where $H(r)$ is the magnitude of the magnetic field in the region indicated, $I$ is the current flow through the conductive path of the current sensor, and, as illustrated in FIG. 3, $r$, $r_i$, $r_o$, $R_o$ and $R_i$ constitute the respective radii of cylinders centered about point 25 on the major axis of pipes 12 and 14 as follows:

$r_i$ is the radius of the inner surface of pipe 12;
$R_i$ is the radius of the outer surface of pipe 12;
$r_o$ is the radius of the inner surface of pipe 14;
$R_o$ is the radius of the outer surface of pipe 14, and
$r$ is the radius of an imaginary concentric cylinder centered about point 25.

As the previous expressions indicate, the magnetic field induced by the current flow through the sensor is substantially null in the space within inner cylinder 12 and the space outside outer cylinder 14. This feature permits sensing wires to be situated in the space inside pipe 12 (i.e., radius r less than or equal to $r_i$) where, as suggested previously, $r_i$ is the radius of the inner surface of the inner cylinder, as illustrated in FIG. 2, and r is the radius of a cylinder centered about point 25 and substantially concentric with cylinder 12. This geometry provides several benefits as described hereinafter.

Figure 1B:
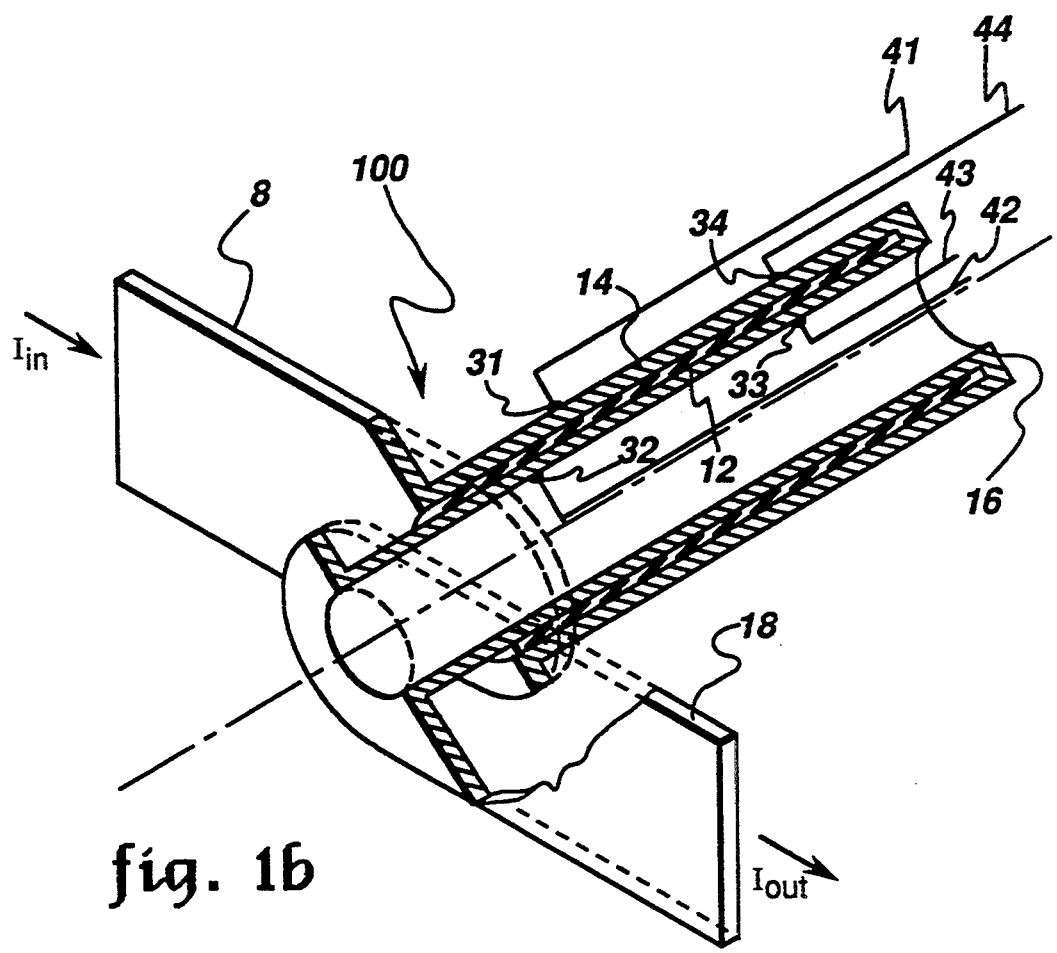
FIG. 1b is an isometric, cross-sectional view of the embodiment of FIG. 1a, taken through a plane including the major axis of the conductive pipes of the embodiment.
Figure 4:
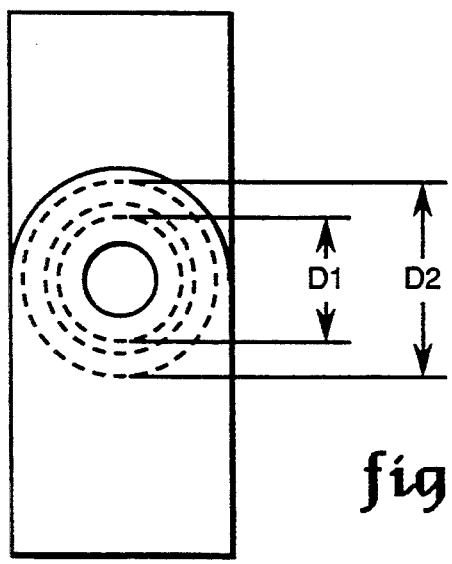
FIG. 4 is a front view of the embodiment in FIG. 1a taken in the direction shown in FIG. 2.

More detail regarding the current sensor geometry is provided by FIGS. 1a, 1b, and 2, respectively. FIG. 1a is a perspective view of one embodiment of a noninductive shunt current sensor 100 in accordance with the invention, whereas FIGS. 2 and 3 are cross-sectional side and front views, respectively. As illustrated in FIG. 2, dimensions L1 and L2 respectively represent the lengths of the inner and outer cylinders from a first end for each respective pipe or cylinder to a second common end for each respective cylinder at end-piece 16. In this particular embodiment, length L2 is greater than length L1. The lengths L1 and L2 may be selected to realize a predetermined resistance that is desired between selected detection or contact points, to be described hereinafter. The diameters D1 and D2, illustrated in FIG. 4, determine at least in part the current sensor resistance as well as the "footprint," or cross-sectional area, of the overall current sensor embodiment. Likewise, these lengths and diameters may be adjusted to provide alternative embodiments of the invention having a predetermined desired size. Likewise, the choice of a material to use in fabricating a current sensor in accordance with the invention may depend on the resistivity of the material as well as its cost. Nonetheless, separate temperature detection may be employed during operation of the current sensor as described hereinafter in connection with FIG. 6 so that, depending on the embodiment, the temperature dependence of the resistivity of the material may be of lesser importance relative to cost and size in such an embodiment.

Figure 5A:
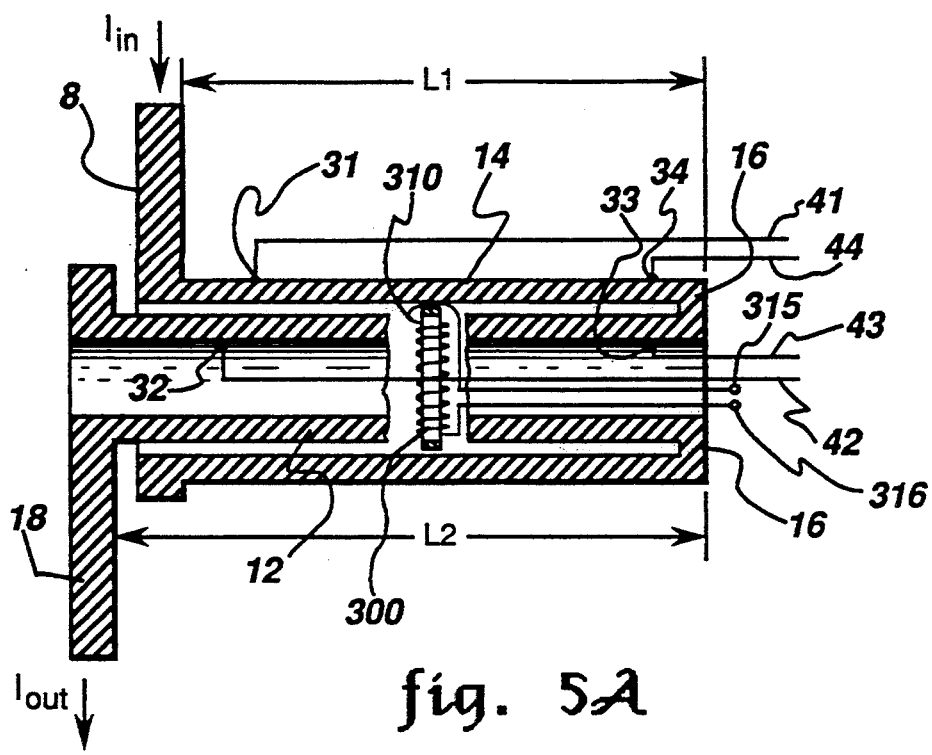
FIGS. 5A and 5B illustrate an embodiment that includes a magnetic core element which allows self-power capability to the noninductive shunt current sensor of the present invention.
Figure 5B:
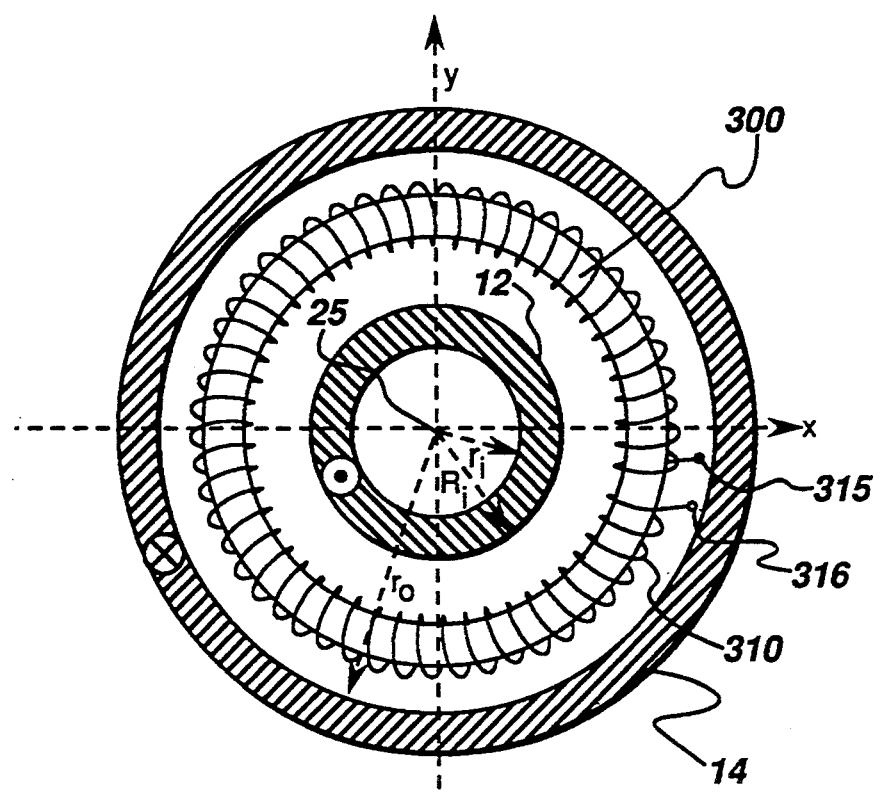

FIGS. 5A and 5B illustrate one aspect of the present invention which allows the noninductive shunt current sensor to advantageously have a self-power capability. A magnetic core element 300 can be substantially enclosed or wrapped by a coil 310 and can be situated between the outer surface of inner pipe 12 and the inner surface of outer pipe 14 for generating a predetermined electrical power output. Core 300 is made of a suitable magnetic material responsive to a varying electromagnetic field which is induced therein by varying current flow through the sensor. The field induced in core 300 in turn induces an alternating voltage in coil 310. The electrical power generated in coil 310 can be supplied through power leads 315 and 316 to a suitable power conditioning circuit (not shown) for powering the various electronic components shown in the embodiment of FIG. 6, for example, and thus advantageously avoiding the need for an external power supply. As will be apparent to those skilled in the art, the magnetization characteristics of core 300 can be conveniently chosen so that, for example, after a saturation condition is reached, the power generated is interrupted to avoid any damage to any electronics connected to power leads 315 and 316.

A noninductive current sensor in accordance with the invention, such as the embodiment previously illustrated, may operate in the following manner. As previously suggested, the parameter to be sensed, current, is based on the voltage drop or voltage difference across the conductive cylinders connected by washer 16. This connection essentially constitutes a resistive shunt between a pair of contact points, such as contact point pair 31-32, 31-33, 32-33, or 31-34, illustrated in FIGS. 1b and 2. As illustrated, this voltage is detected by measuring the voltage across the lead pairs 41-42, 41-43, 42-43, or 41-44, respectively. The connections 31-41, 32-42, 33-43, or 34-44 may be made in a convenient fashion because substantially no magnetic field is present in the space through which the wires or other connections pass.

Yet another advantage of a current sensor in accordance with the present invention is obtained by employing it in a typical three-phase network. Because the coupling between the current sensors of the various phases is substantially nulled by the structure previously described, the choice of the 31-41 or 34-44 connection illustrated in FIGS. 1b and 2 is enabled in this environment with a consequential increase in sensitivity. This is particularly advantageous where the current sensor is employed to measure current in a three-phase network. In such a situation, three or more current sensors may be employed in close proximity. Thus, use of a noninductive shunt current sensor in accordance with the invention will reduce or substantially eliminate the mutual coupling effects that may degrade the quality of the sensor current measurements.

Figure 6:
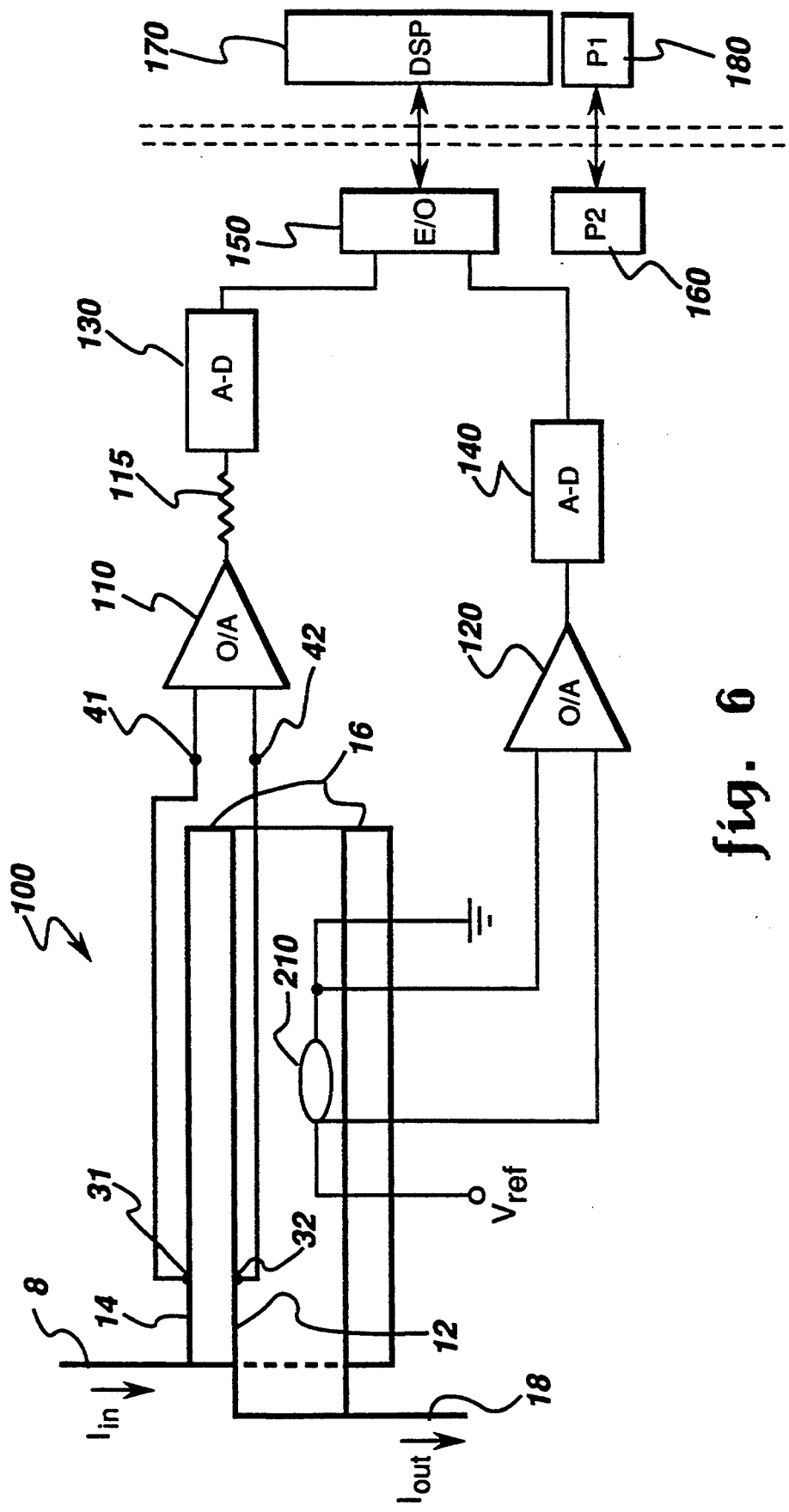
FIG. 6 is an alternative embodiment of a noninductive shunt current sensor in accordance with the invention that includes output signal demodulation circuitry.

Demodulation and front end signal conditioning of the signal voltage sensed by the noninductive current sensor in accordance with the invention may be accomplished in any one of a number of approaches. A typical front end signaling condition approach to carry out this demodulation is illustrated by the embodiment of FIG. 6. Here, current sensor 100 is coupled to an operational amplifier (O/A) 110, which detects the voltage across conductors 41-42, for example, and provides an initial amplification. This analog signal is then digitized by an analog-to-digital converter 130 after scaling of the output signal by a resistance 115. Likewise, the voltage detected across a thermistor 210 is amplified by an operational amplifier 120 and digitized by an analog-to-digital converter 140. In particular, the resistance across the thermistor is a known function of the temperature. Thus, the voltage and the change in voltage across the thermistor provides a measure of the temperature and its change, which may be employed as previously described to reduce temperature dependence as a source of error for the current measurement obtained. It will be appreciated that any number of signal amplifiers will suffice in addition to an operational amplifier, such as an instrumentation amplifier.

Because the line voltage in a typical metering application is likely to be high, the results of the digitization may be transferred or isolated through an electro-optic (E/O) interface 150 to digital signal processing (DSP) circuitry 170. This circuitry is typically not at the line potential, thus providing satisfactorily isolation to enhance safety. The digital signal processing is employed to perform filtering and further signal conditioning, such as to remove the temperature dependence of the resistivity from the voltage measurement based on the output signal provided by thermistor 210 or to remove the effects of higher order harmonics. Consistent with an embodiment providing line voltage isolation, power to the circuitry may be supplied either through a power optical interface or through magnetic coupling, such as provided between power supplies 160 and 180. Likewise, isolated power supplies (not shown) may be employed instead of the above power transfer process.

In addition to avoiding the problems normally attributed to the presence of mutual induction in the connections or wires in the sensing scheme and thereby increasing the measurement sensitivity and accuracy, a noninductive current sensor in accordance with the invention provides a number of other advantages. For example, in comparison with inductive current sensors, a noninductive current sensor in accordance with the invention has the capability to measure direct current as well as alternating current. Furthermore, a noninductive current sensor in accordance with the invention provides robust current measurements with less costly materials in comparison with inductive current sensors because no need is present to align a sensing element, such as for sensing changes in magnetic flux, with the electromagnetic field and, likewise, only two contact points and associated leads are needed to obtain a current measurement in a noninductive sensing scheme. Furthermore, noninductive current sensors in accordance with the invention may be adapted to accommodate other inductive sensing schemes to provide more than one current measurement, such as described in copending patent application Ser. No. 08/085,789 (RD-22,349) and patent application Ser. No. 08/085,790 (RD-23,045). Furthermore, as suggested earlier, a noninductive shunt current sensor in accordance with the present invention may be employed to obtain highly accurate measurements in a three-phase network power transfer configuration. In this situation, the mutual coupling that usually results from having the current sensors in close proximity with each other is reduced or eliminated because substantially no magnetic field is present outside the outer cylinder or pipe. One more advantage of the invention is that it avoids the use of magnetic insulation, which is undesirable due to the additional expense and bulkiness it would introduce. Likewise, a magnetic field having a strong DC component may saturate the magnetic insulation making it virtually ineffective.

Figure 7:
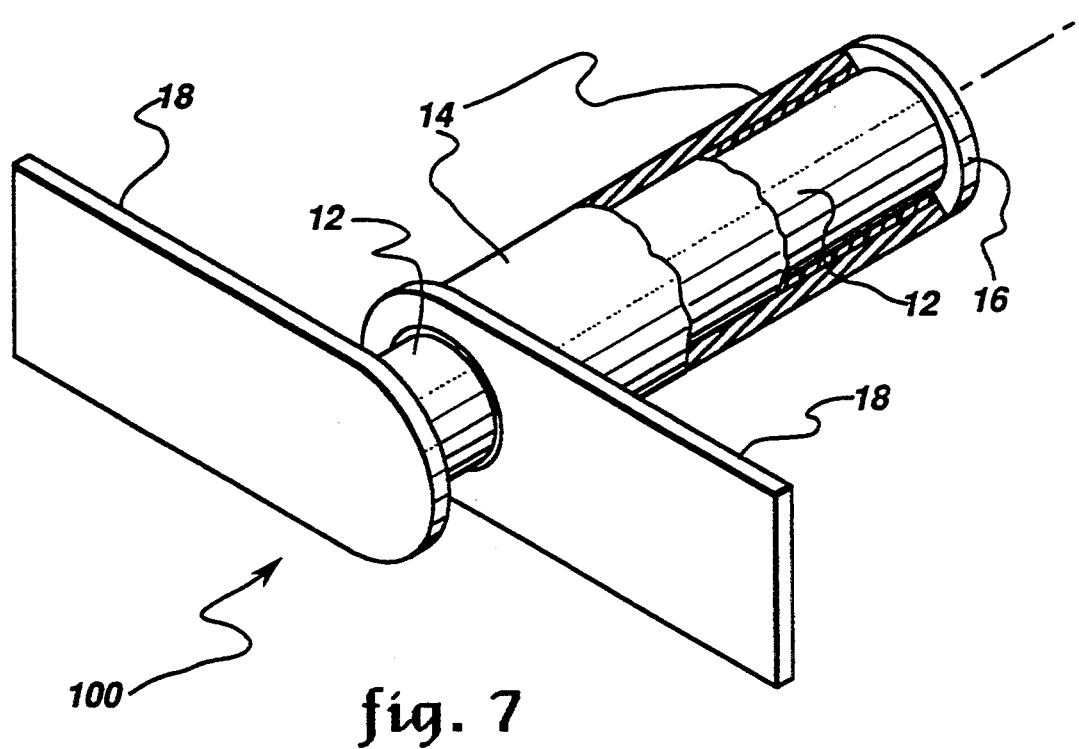
FIG. 7 is yet another alternative embodiment of a noninductive shunt current sensor in accordance with the invention.

A noninductive shunt current sensor in accordance with the invention may be employed to noninductively measure electrical current flow in the following manner. Electrical current may be conducted through a first conductive cylindrical pipe in a first direction, such as through outer pipe 14. The current conducted in a first direction is also conducted through a second conductive cylindrical pipe, such as inner pipe 12, concentric to the first pipe in a second direction, the second direction being opposite the first direction. In either case, the magnetic field formed due to such conducted current between the outer surface of inner pipe 12 and the inner surface of outer pipe 14 advantageously excites a power generator made up of magnetic core element 300 and coil 310 in order to generate a predetermined electrical power output, thus avoiding the need for an external power supply and improving the portability of the current sensor. The current may, alternatively, be conducted through a solid cylindrical-shaped conductive element instead of an inner pipe, such as illustrated in FIG. 7. Either direction of conduction of electrical current may take place through the inner pipe and through the outer pipe, so long as it takes place in opposite directions as described. This may be accomplished through a conductive bridge, such as a washer 16, electrically connecting outer pipe 14 to inner pipe 12 at their respective second ends. Thus, a reverse of polarity should have the effect of changing the direction of electrical conduction in both the inner pipe and the outer pipe. The voltage drop or difference is measured between two contact points on the surfaces of the pipes, such as a contact point 31 or 34 on the outer surface of outer pipe 14 and a contact point 32 or 33 on the inner surface of inner pipe 12. As previously suggested, this has the advantage of avoiding inductive effects because the magnetic field in the space outside the outer pipe or the space inside the inner pipe is substantially null. However, for the embodiment illustrated in FIG. 7, the contact points must be located on the outer surface of outer pipe 14. Typically, the voltage difference or drop is measured at two contact points using sensing wires. Finally, the voltage difference or drop measurement is converted to a current measurement by a conventional technique.

For the embodiment illustrated in FIG. 6, a method of noninductively measuring electrical current flow may include some additional steps. In particular, the temperature or temperature change of at least one of the pipes or even both of the pipes may be measured. Then, as part of the previously mentioned converting step, the temperature or temperature change measurement is converted to a resistivity measurement and any change in resistivity due to the temperature change is filtered from the voltage difference measurement based on the contact points to obtain the current flow measurement. Typically, the step of measuring the temperature or change in temperature of one or both pipes will comprise measuring the change in voltage across a conductive material having a known resistivity as a function of temperature that is thermally coupled to the pipe or pipes whose temperature is being measured. Likewise, in an alternative embodiment in which line voltage isolation is desired, prior to the step of converting the various voltage and change in voltage measurements, either to measure current, temperature, change in temperature, or a combination thereof, these measurements may be electro-optically transmitted, such as to a digital signal processor, for further signal processing.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A noninductive shunt current sensor comprising:
a cylindrical-shaped conductive element having a first end, a second end, an outer surface, and a major axis extending from the first end to the second end;
a conductive pipe concentric to said conductive element, having a first end, a second end, an inner surface, an outer surface, and a major axis extending from the first end of said pipe to the second end of said pipe;
the inner surface of said pipe being radially spaced at a predetermined distance from the outer surface of said conductive element;
said pipe and said conductive element being connected at their respective second ends by an electrically conductive bridge; and
electrical power generating means situated between said pipe and said conductive element for generating a predetermined electrical power in response to an electromagnetic field formed during current flow through said current sensor.

2. The noninductive shunt current sensor of claim 1, wherein said power generating means comprises a magnetic core element and a coil substantially enclosing said magnetic core element.

3. The noninductive shunt current sensor of claim 1, wherein the first end of said conductive element extends beyond the first end of said pipe.

4. The noninductive shunt current sensor of claim 3, wherein said cylindrical-shaped conductive element has a cylindrical-shaped passage extending from the first end of said conductive element to the second end of said conductive element, thereby forming another conductive pipe having an inner and outer surface; said noninductive shunt current sensor further comprising first and second sensing wires, each electrically connected to a contact point on a respective one of the inner and outer surfaces of said pipes.

5. The noninductive shunt current sensor of claim 4, wherein said pipes are positioned relative to each other so that their respective second ends are substantially co-planar.

6. The noninductive shunt current sensor of claim 5, wherein said pipes and said conductive bridge are comprised of metal.

7. The noninductive shunt current sensor of claim 6, and further comprising a first conductor plate connected to the outer pipe and a second conductor plate connected to the inner pipe, said first and second conductor plates being adapted to connect said current sensor in series with a current source.

8. The noninductive shunt current sensor of claim 4, and further comprising a first conductor connected to the first end of the outer pipe and a second conductor connected to the first end of the inner pipe, said current sensor being adapted to form said electromagnetic field during current flow through said current sensor between said first conductor and said second conductor;
the electromagnetic field formed radially within the inner surface of the inner pipe being substantially null.

9. The noninductive shunt current sensor of claim 8, wherein the electromagnetic field formed radially beyond the outer surface of the outer pipe is substantially null.

10. The noninductive shunt current sensor of claim 9, wherein the electromagnetic field formed between the inner surface of the inner pipe and the outer surface of the outer pipe has a magnitude substantially in accordance with the following equations:

$$H(r) = \begin{cases} \dfrac{I}{2\pi r} \dfrac{r^2 - r_i^2}{R_i^2 - r_i^2} & r_i \leq r \leq R_i \\ \dfrac{I}{2\pi r} & r_i \leq r \leq r_o \\ \dfrac{I}{2\pi r} \dfrac{R_o^2 - r^2}{R_o^2 - r_o^2} & r_o \leq r \leq R_o, \end{cases}$$

where
$r_i$ is the radius of the inner surface of the inner pipe;
$R_i$ is the radius of the outer surface of the inner pipe;
$r_o$ is the radius of the inner surface of the outer pipe; and
$R_o$ is the radius of the outer surface of the outer pipe; and
$r$ is the radius of an imaginary cylinder substantially concentric with the inner and outer pipes.

11. The noninductive shunt current sensor of claim 8, including an insulating material substantially filling the space between said two pipes extending from the first end of the outer pipe to the second end of the outer pipe.

12. The noninductive shunt current sensor of claim 11 wherein said insulating material is a polyimide.

13. The noninductive shunt current sensor of claim 11, and further comprising an amplifier having two input ports electrically connected to said first and second sensing wires, respectively.

14. A method for noninductively measuring electrical current flow while simultaneously generating electrical power, said method comprising the steps of:
  conducting electrical current through a cylindrical-shaped conductive element in a first direction, said conductive element having an outer surface;
  conducting electrical current through a conductive pipe in a second direction substantially opposite the first direction, said pipe being concentric to said conductive element and having an inner and outer surface, the electrical current conducted in a first direction and the electrical current conducted in a second direction being the same current;
  generating power in response to an induced electromagnetic field between said conductive element and said pipe resulting from conduction of said electrical current;
  measuring the voltage change between two contact points, the contact points each being located on one of the surfaces of said pipe and said conductive element; and
  converting the voltage change measurement to a current measurement.

15. The method of claim 14, wherein said cylindrical-shaped conductive element comprises a conductive pipe having an inner and outer surface and wherein the contact points are located on one of the surfaces selected from the group consisting essentially of the inner surface of the inner pipe and the outer surface of the outer pipe.

16. The method of claim 15, and further comprising the step of measuring the temperature of at least one of said pipes;
  wherein the step of converting the voltage change measurement includes the steps of:
  converting the temperature measurement to a resistivity measurement; and
  filtering any change in resistivity due to temperature from the voltage change measurement.

17. The method of claim 16, wherein the step of measuring the temperature of at least one of said pipes comprises the step of measuring the voltage across a conductive material thermally coupled to said at least one pipe.

18. The method of claim 17, including, prior to the step of converting the voltage change measurement, the step of electro-optically transmitting, to signal processing apparatus for further signal processing, the voltage change measurement between the contact points and the voltage measurement across the conductive material thermally coupled to said at least one pipe.

* * * * *

UNITED STATES PATENT AND TRADEMARK OFFICE
CERTIFICATE OF CORRECTION

PATENT NO.    : 5,446,372
DATED         : August 29, 1995
INVENTOR(S)   : Berkcan It is certified that error appears in the above-indentified patent and that said Letters Patent is hereby corrected as shown below:

On the title page, item [*] and item [63] should read as follows:

[*] Notice: The portion of the term of this patent subsequent to July 6, 2013 has been disclaimed.

[63] Continuation-in-part of Ser. No. 85,787, Jul. 6, 1993, Pat. No. 5,420,504. Issued May 30, 1995.

Signed and Sealed this

First Day of October, 1996

Attest:

BRUCE LEHMAN

*Attesting Officer*    *Commissioner of Patents and Trademarks*